(12) United States Patent
Kwon et al.

(10) Patent No.: US 11,963,436 B2
(45) Date of Patent: Apr. 16, 2024

(54) BENDING AREA SIDE SURFACE PROTECTIVE LAYER AND DISPLAY DEVICE HAVING THE SAME

(71) Applicant: Samsung Display Co., LTD., Yongin-si (KR)

(72) Inventors: Seung Wook Kwon, Yongin-si (KR); Jeong Seok Lee, Yongin-si (KR); Chan Ho Moon, Yongin-si (KR); Woo Yong Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/844,796

(22) Filed: Jun. 21, 2022

(65) Prior Publication Data

US 2022/0320448 A1 Oct. 6, 2022

Related U.S. Application Data

(62) Division of application No. 16/995,919, filed on Aug. 18, 2020, now Pat. No. 11,398,609.

(30) Foreign Application Priority Data

Feb. 11, 2020 (KR) .......................... 10-2020-0016653

(51) Int. Cl.
*H10K 50/84* (2023.01)
*H10K 50/844* (2023.01)
(Continued)

(52) U.S. Cl.
CPC ......... *H10K 77/111* (2023.02); *H10K 50/844* (2023.02); *G02F 1/133305* (2013.01);
(Continued)

(58) Field of Classification Search
CPC ............ H10K 77/111; H10K 2102/311; H10K 50/844; H10K 50/8426; H10K 59/12; H10K 59/131; H10K 59/38; H10K 59/122; H10K 59/1213; H10K 59/123; H10K 59/124; H10K 59/1315; H10K 59/35; G02F 1/133305; G09F 9/301; G09G 3/3283;
(Continued)

(56) References Cited

U.S. PATENT DOCUMENTS 9,614,168 B2 4/2017 Zhang et al.
9,812,659 B2 11/2017 Kwon et al.
(Continued)

FOREIGN PATENT DOCUMENTS

JP 2018028663 A * 2/2018 ............. G09F 9/301
KR 1020190020266 A 2/2019
KR 1020190027409 A 3/2019

*Primary Examiner* — Ida M Soward
(74) *Attorney, Agent, or Firm* — CANTOR COLBURN LLP

(57) ABSTRACT

A display device includes a display panel including a main area, a bending area at which the display panel is bendable, and a sub area, in order. The main area includes a display area and a non-display area which is adjacent to the display area. The bending area connects the sub area to the main area at the non-display area thereof, and is recessed from outer side surfaces of the main area and the sub area, to define a recess portion of the display panel at the bending area.

11 Claims, 15 Drawing Sheets

(51) Int. Cl.
*H10K 59/12* (2023.01)
*H10K 59/13* (2023.01)
*H10K 59/38* (2023.01)
*H10K 77/10* (2023.01)
*G02F 1/1333* (2006.01)
*G09F 9/30* (2006.01)
*G09G 3/3283* (2016.01)
*G09G 3/3291* (2016.01)
*H10K 50/842* (2023.01)
*H10K 59/131* (2023.01)
*H10K 102/00* (2023.01)

(52) U.S. Cl.
CPC ........... *G09F 9/301* (2013.01); *G09G 3/3283* (2013.01); *G09G 3/3291* (2013.01); *G09G 2300/0408* (2013.01); *G09G 2300/0804* (2013.01); *H10K 50/8426* (2023.02); *H10K 59/12* (2023.02); *H10K 59/131* (2023.02); *H10K 59/38* (2023.02); *H10K 2102/311* (2023.02)

(58) Field of Classification Search
CPC ......... G09G 3/3291; G09G 2300/0408; G09G 2300/0804; G09G 2380/02; G06F 1/1652
See application file for complete search history.

(56) References Cited

U.S. PATENT DOCUMENTS

| | | | |
|---|---|---|---|
| 10,090,490 B2 | 10/2018 | Misono | H01L 51/56 |
| 10,535,826 B2 | 1/2020 | Kim et al. | |
| 10,600,991 B2 | 3/2020 | Kwon et al. | |
| 10,620,668 B2* | 4/2020 | Park | G06F 1/1681 |
| 10,678,304 B2 | 6/2020 | Namkung | G06F 3/0412 |
| 10,725,353 B2 | 7/2020 | Jeon | G02F 1/133305 |
| 10,838,457 B2* | 11/2020 | Yu | H04M 1/0216 |
| 10,873,043 B2 | 12/2020 | Jin | G06F 3/0445 |
| 11,069,866 B2 | 7/2021 | Wang | H01L 27/3258 |
| 11,269,380 B2* | 3/2022 | Cho | G09F 9/301 |
| 2017/0194580 A1 | 7/2017 | Lee | H01L 51/5256 |
| 2017/0250366 A1 | 8/2017 | Andou | H01L 51/5237 |
| 2017/0352717 A1 | 12/2017 | Choi | H01L 51/0097 |
| 2018/0013095 A1* | 1/2018 | Choi | H10K 50/844 |
| 2018/0090702 A1* | 3/2018 | Um | H10K 50/844 |
| 2018/0123061 A1 | 5/2018 | Suzuki | H01L 51/5246 |
| 2018/0151644 A1 | 5/2018 | Han | H01L 27/3244 |
| 2018/0180911 A1 | 6/2018 | Odaka | H01L 51/5293 |
| 2018/0247992 A1 | 8/2018 | Cho | H01L 27/3276 |
| 2019/0033493 A1* | 1/2019 | Kwon | B32B 27/06 |
| 2019/0057645 A1 | 2/2019 | Kwon et al. | |
| 2019/0058028 A1 | 2/2019 | Won | H01L 51/56 |
| 2019/0280075 A1 | 9/2019 | Chung | H05K 1/189 |
| 2019/0341566 A1* | 11/2019 | Lee | G02F 1/1345 |
| 2019/0350081 A1* | 11/2019 | Park | G06F 1/203 |
| 2019/0372051 A1* | 12/2019 | Kwon | H10K 77/111 |
| 2019/0378860 A1 | 12/2019 | Kwak | H01L 27/3276 |
| 2020/0019212 A1* | 1/2020 | Jung | G06F 1/1641 |
| 2020/0022267 A1* | 1/2020 | Han | B32B 27/306 |
| 2020/0057471 A1* | 2/2020 | Nam | G06F 1/1641 |
| 2020/0067016 A1 | 2/2020 | Park | H01L 51/5256 |
| 2020/0089368 A1 | 3/2020 | Shim | H01L 27/3276 |
| 2020/0119118 A1 | 4/2020 | Kim | H01L 27/3246 |
| 2020/0133344 A1* | 4/2020 | Park | H10K 59/1201 |
| 2020/0135835 A1 | 4/2020 | Seo | H01L 27/3276 |
| 2020/0185641 A1 | 6/2020 | Jeong | H01L 51/0097 |
| 2020/0328375 A1 | 10/2020 | Won | H01L 27/3225 |
| 2021/0072791 A1* | 3/2021 | Yu | G06F 1/1656 |
| 2021/0280826 A1 | 9/2021 | Kim | H01L 51/5281 |

* cited by examiner

BENDING AREA SIDE SURFACE PROTECTIVE LAYER AND DISPLAY DEVICE HAVING THE SAME

This application is a divisional application of U.S. application Ser. No. 16/995,919 filed Aug. 18, 2020 and issued as U.S. Pat. No. 11,398,609 on Jul. 26, 2022, which claims priority to Korean Patent Application No. 10-2020-0016653, filed on Feb. 11, 2020, and all the benefits accruing therefrom under 35 U.S.C. § 119, the content of which in its entirety is herein incorporated by reference.

BACKGROUND

1. Field

The disclosure relates to a display device.

2. Description of the Related Art

Importance of a display device is increasing with development of multimedia. In response, various types of display devices, such as a liquid crystal display ("LCD") and an organic light emitting diode ("OLED") display device, are used.

The organic light emitting diode display device displays an image using an organic light emitting diode ("OLED") that generates light by recombination of an electron and a hole. The organic light emitting diode display device has advantages that a response speed is fast, a luminance and a viewing angle are large, and the organic light emitting diode display device is driven at low power consumption.

SUMMARY

One or more embodiment provides a display device capable of reducing or effectively preventing a defect due to a protrusion portion (or a tip) generated on a side surface of a bending area of the display panel in processing of a protective film for bending of the display panel.

The disclosure is not limited to the above-described features, and other technical features that are not described may be clearly understood by those skilled in the art from the following description.

A display device includes a display panel including a main area, a bending area at which the display panel is bendable, and a sub area, in order. The main area includes a display area and a non-display area which is adjacent to the display area. The bending area connects the sub area to the main area at the non-display area thereof, and is recessed from outer side surfaces of the main area and the sub area, to define a recess portion of the display panel at the bending area.

The display device may further include a first protective film disposed under the main area, and a second protective film disposed under the sub area.

The first protective film and the second protective film may not overlap the bending area.

The first protective film and the second protective film may overlap with each other.

The display device may further include an adhesive layer disposed between the first protective film and the second protective film.

One surface of the adhesive layer may be in contact with the first protective film, and another surface of the adhesive layer may be in contact with the second protective film.

The recess portion may include a first surface, a second surface opposite to the first surface, and a third surface disposed between the first surface and the second surface.

The third surface may be disposed inside the side surface of the sub area, such as being spaced apart from the outer side surfaces of the main area and sub area.

A width of the first surface may be 400 nanometers (nm) to about 800 nm.

The display area may include a front display area, a first side display area extending from a first side of the front display area, and a second side display area extending from a second side of the front display area.

A display device includes a display panel including a main area including a display area, a bending area at which the display panel is bendable, and a sub area, in order, and each of the main area, the bending area and the sub area including an upper surface, a lower surface which is opposite to the upper surface, and an outer side surface connecting the upper surface to the lower surface; a protective layer facing the lower surface of the display panel and extended along the display panel, the protective layer including a protrusion portion facing the outer side surface of the bending area and extended outwardly from the outer side surface of the bending area; and a coating layer extended along an outer surface of the protrusion portion.

The display device may further include a first protective film disposed under the main area, and a second protective film disposed under the sub area.

The first protective film, the second protective film, and the protrusion portion may be respective portions of a same material layer.

A thickness of the protrusion portion may be smaller than a thickness of the first protective film and a thickness of the second protective film.

The first protective film and the second protective film may not overlap the bending area.

One end of the protrusion portion may be in contact with the one side of the bending area, and another end of the protrusion portion may be separated from the display panel.

One end of the protrusion portion may be in contact with the other side of the bending area, and another end of the protrusion portion may be separated from the display panel.

One end of the protrusion portion may be in contact with the one side of the bending area, and another end of the protrusion portion may be in contact with the other side of the bending area.

The coating layer may directly cover the protrusion portion.

The coating layer may include a photopolymer resin composition.

Specific details of other embodiments are included in the detailed description and drawings.

According to one or more embodiment of the display device, since the outer side surface of the bending area of the display panel defines the recess portion, a defect due to the protrusion portion of the protective layer may be reduced or effectively prevented even though the protrusion portion that is generated on the outer side surface of the bending area is not physically removed from a remainder of the display panel.

In addition, by including the coating layer that covers the protrusion portion positioned on the outer side surface of the bending area, the defect due to the protrusion portion may be reduced or effectively prevented even though the protrusion portion is not physically removed from a remainder of the display panel.

Effects according to embodiments are not limited by the contents illustrated above, and more various effects are included in the present specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
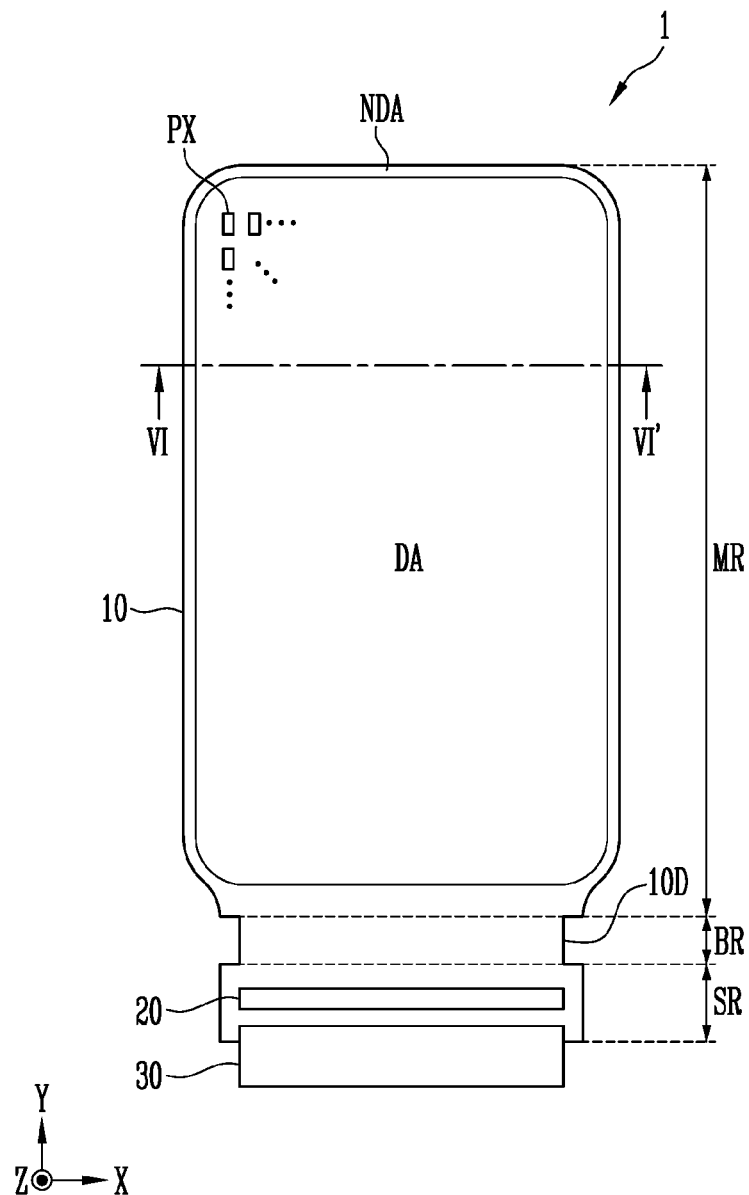
FIG. 1 is a top plan view of an embodiment of a display device.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and those skilled in the art to which the disclosure pertains can fully understand the scope of the disclosure. The disclosure is only defined by the scope of the claims.

A case in which an element or a layer is referred to as be related to another element such as being "on" another element or layer includes a case in which another layer or another element is disposed directly on the other element or between the other layers. In contrast, when an element or a layer is referred to as be related to another element such as being "directly on" another element or layer includes a case in which no intervening layer or element is disposed between the layers.

The same reference numerals denote to the same components throughout the specification. A shape, a size, a ratio, an angle, the number, and the like disclosed in the drawings for describing the embodiments are exemplary, and thus, the disclosure is not limited thereto.

Although first, second, and the like are used to describe various components, these components are not limited by these terms. These terms are used only to distinguish one component from another component. Therefore, a first component mentioned below may be a second component within the technical spirit of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Each of features of various embodiments of the disclosure may be coupled or combined with each other in part or in whole, and technically various interlocking and driving is possible. Each embodiment may be implemented independently of each other and association thereof may be implemented together.

Hereinafter, specific embodiments will be described with reference to the accompanying drawings.

In order to easily bend a display panel 10 of the display device 1, a portion of a protective film PF under a bending area BR of the display panel 10 may be removed. In a process of melting and removing a portion of the protective film PF, a melted form of the protective film PF may be moved around the bending area BR of the display panel 10, and the melted form of the protective film PF may act as a foreign substance in the display panel 10.

Figure 2:
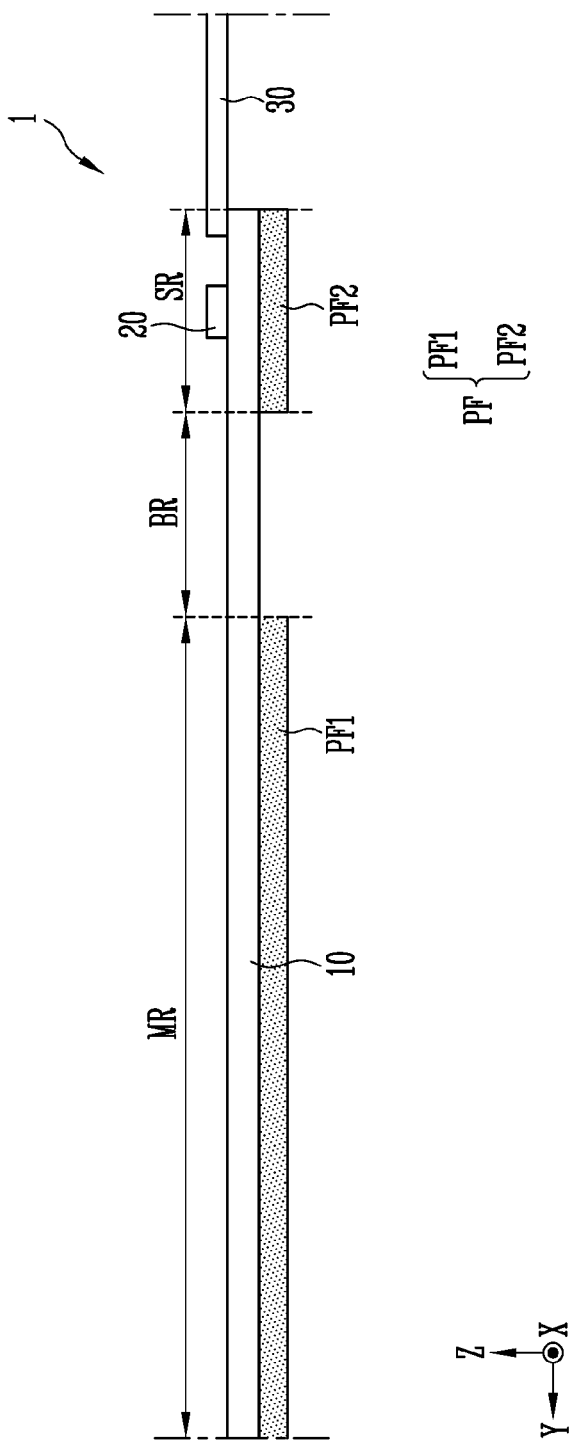
FIG. 2 is a cross-sectional side view of the display device of FIG. 1 which is unbent.
Figure 3:
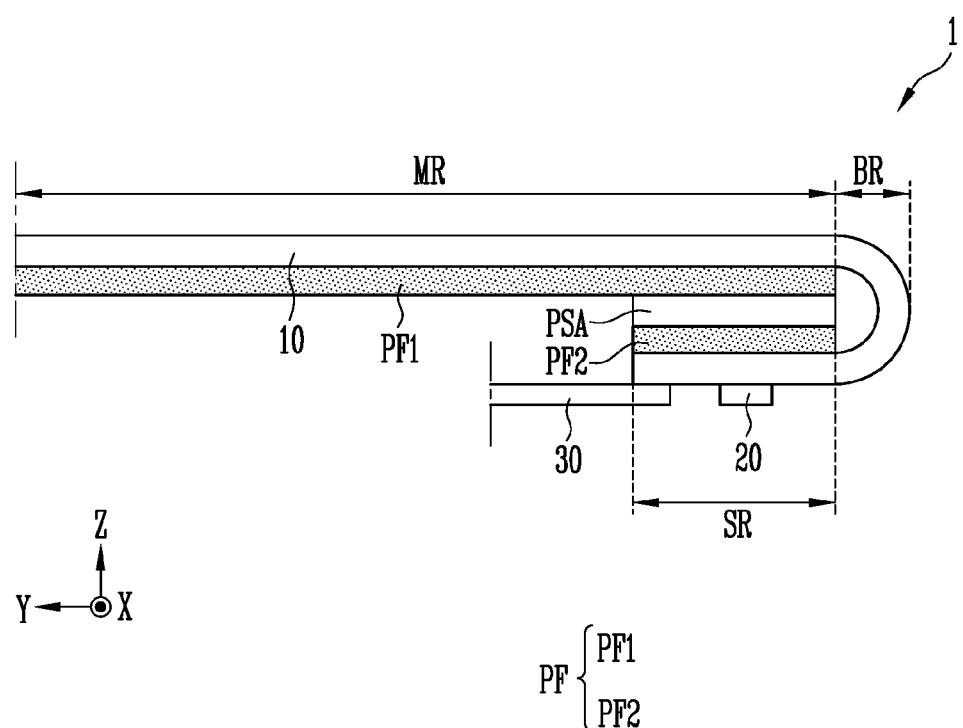
FIG. 3 is a cross-sectional side view of the display device of FIG. 1 which is bent.

FIG. 1 is a top plan view of an embodiment of a display device 1. FIG. 2 is a cross-sectional side view of an embodiment of the display device 1 of FIG. 1 which is unbent or flat. FIG. 3 is a cross-sectional side view of an embodiment of the display device 1 of FIG. 1 which is bent.

In the present specification, "upper portion," "top" and "upper surface" indicate an upper direction, that is, a Z-axis direction with respect to a display device 1, and "lower portion," "bottom" and "lower surface" indicate a lower direction, that is, a direction opposite to the Z-axis direction with respect to the display device 1. In addition, "left," "right," "up" and "down" indicate directions in a top plan view of the display device 1 taken in the direction opposite to the Z-axis direction. For example, "left" indicates a direction opposite to an X-axis direction, "right" indicates the X-axis direction, "up" indicates a Y-axis direction, and "down" indicates a direction opposite to the Y-axis direction.

The X-axis direction, the Y-axis direction and the Z-axis direction cross each other respectively. The display device 1 and various components thereof may be disposed in a plane defined by a first direction (e.g., one among the X-axis direction or Y-axis direction) and a second direction (e.g., the other of the X-axis direction and the Y-axis direction) which cross each other. A thickness of the display device 1 and various components thereof may be defined along a third direction (e.g., along the Z-axis direction).

Referring to FIG. 1, the display device 1 may be applied to various electronic devices including a relatively small-sized and a relatively medium-sized electronic device such as a tablet personal computer ("PC"), a smartphone, a car navigation unit, a camera, a center information display ("CID") provided in a car, a watch-type electronic device, a personal digital assistant ("FDA"), a portable multimedia player ("PMP") or a game machine, and a relatively medium-sized and a relatively large-sized electronic device such as a television, an external billboard, a monitor, a personal computer or a notebook computer. These are merely presented as an embodiment, and the display device 1 may be employed in other electronic devices without departing from the concept of the disclosure.

The display device 1 may have a planar rectangular shape. In an embodiment, for example, the display device 1 may have a rectangular planar shape having relatively short sides extended along a first direction (X-axis direction) and relatively long sides extended along a second direction (Y-axis direction). A corner where the short side of the first direction (X-axis direction) and the long side of the second direction (Y-axis direction) meet each other, may be rounded to have a curvature or may define a right angle. A planar shape of the display device 1 is not limited to a rectangle, and may have a planar shape of another polygon, a circle or an ellipse.

The display device 1 may include a display panel 10. The display panel 10 may be a light emitting display panel including a light emitting element (e.g., display element). In an embodiment, for example, the display panel 10 may be an organic light emitting display panel using an organic light emitting diode, a micro light emitting diode display panel using a micro light emitting diode ("LED"), or a quantum dot light emitting display panel including a quantum dot light emitting diode. Hereinafter, description will be given based on an example in which the display panel 10 is the organic light emitting display panel.

The display panel 10 may include a display area DA, which is a planar area at which an image is displayed, and a non-display area NDA except for the display area DA. The display area DA may include a pixel PX provided in plurality (e.g., a plurality of pixels PX).

Each of the plurality of pixels PX may emit one of a red, a green and a blue light, but is not limited thereto. In an embodiment, for example, each of the plurality of pixels PX may emit one of cyan, magenta, yellow and white light.

The plurality of pixels PX may be arranged in a matrix form to form a row and a column along the first direction (X-axis direction) and the second direction (Y-axis direction) which crosses the first direction (X-axis direction), respectively. However, the arrangement of the pixels PX is not limited thereto, and may be modified in various forms.

The non-display area NDA may be a planar area in which drivers for driving the plurality of pixels PX, and various conductive line portions (not shown) which connect the pixel PX and the drivers to each other are provided. The non-display area NDA may be disposed adjacent to at least one side of the display area DA. The non-display area NDA may extend from a side of the display area DA and form a boundary therewith. In an embodiment, for example, the non-display area NDA may be disposed to surround the display area DA in the top plan view.

The display panel 10 may include a bending area BR at which the display panel 10 and various component thereof is bendable, a main area MR adjacent to and extending from a first side of the bending area BR, and a sub area SR adjacent to and extending from a second side of the bending area BR which is opposite to the first side thereof. The main area MR and/or the sub area SR may be a planar area at which the display panel 10 is not bendable or remains flat even when the display panel 10 is bent at the bending area BR. The display device 1 and/or various components of the display panel 10 may include a bending area BR, a main area MR and a sub area SR corresponding to those described above.

The main area MR may include the display area DA and a portion of the non-display area NDA. The non-display area NDA may be disposed adjacent to the display area DA of the main area MR. The bending area BR and the sub area SR may include respective portions of the non-display area NDA. The display device 1 and/or the display panel 10 may define a display surface at which an image is displayed. The display surface may be a surface disposed furthest along the Z-axis direction, without being limited thereto.

In the non-display area NDA of the main area MR, a conductive line such as a signal line or driving circuit 20 for applying an electrical signal to the display area DA may be disposed. In addition, a light-blocking member such as an outermost black matrix may be disposed in the non-display area NDA of the main area MR, but is not limited thereto.

The bending area BR may be disposed extended from one side of the main area MR. Referring to FIG. 1, for example, the bending area BR may extend from an edge of the non-display area NDA of the main area MR. The display panel 10 may be bendable at the bending area BR to define a curvature, in a direction opposite to the third direction (Z-axis direction), that is, in a direction opposite to a display surface.

The display panel 10 which is bent in the bending area BR may reverse a facing direction of a surface of the display panel 10. That is, a surface facing upward in the display panel 10 which is unbent (FIG. 2), may be changed to face outward and then face downward again (FIG. 3) owing to a curvature of the bending area BR. Referring to FIG. 2, for example, the display panel 10 which is unbent or flat may define an upper surface at each of the main area MR, the bending area BR and the sub area SR, which faces upward in the Z-axis direction. Referring to FIG. 3, the display panel 10 which is bent disposes a bent portion of the upper surface at the bending area BR facing outward along the Y-axis direction and a portion of the upper surface at the sub area SR facing downward in the direction opposite to the Z-axis direction. The display device 1 which is bent (FIG. 3) provides an end portion of the display device 1 defined by the bending area BR.

Referring to FIG. 1, a dimension of the bending area BR along the X-axis direction may be smaller than a dimension of the sub area SR and a dimension of the main area MR along the X-axis direction. The sub area SR may extend further than an end of the bending area BR and an end of the main area MR, along the X-axis direction. Ends of the bending area BR may define a recess portion 10D together with the main area MR and the sub area SR. The recess portion 10D is disposed inside a side surface (e.g., end surface or outer side surface) of a sub area SR, which will be described later. As the recess portion 10D is defined at the bending area BR, a defect from bending of the display panel 10 may be reduced or effectively prevented. Detailed description thereof will be described later with reference to FIGS. 4 and 5.

The sub area SR may extend from an end or edge of the bending area BR. Referring to FIG. 3, for example, the display panel 10 which is bent may dispose the sub area SR substantially parallel to the main area MR. The display panel 10 which is bent disposes the sub area SR to overlap the main area MR along the third direction (Z-axis direction). The display panel 10 which bent may dispose the sub area SR to overlap the non-display area NDA at a distal end or edge of the main area MR and to overlap the display area DA of the main area MR.

The sub area SR may be a planar area where a driver such as a driving circuit 20 is provided. The driving circuit 20 may output electrical signals and electrical voltages for driving and controlling the display panel 10. In an embodiment, for example, the driving circuit 20 may supply a data voltage as an electrical signal to the data line as a conductive signal line. According to an embodiment, the driving circuit 20 may supply a power voltage as an electrical signal to a power line as a conductive signal line, and supply a scan control signal as an electrical signal to a gate driver. The driving circuit 20 may be provided or formed as an integrated circuit ("IC") and disposed in the sub area SR such as by using a chip on glass ("COG") method, a chip on plastic ("COP") method or an ultrasonic bonding method, but is not limited thereto.

A circuit board 30 which is external to the display panel 10, may be attached to the display panel 10 at the sub area SR thereof. Where the driving circuit 20 is considered attached to a first end of the sub area, the circuit board 30 may be considered attached to a second end of the sub area SR which is opposite to the first end thereof. The circuit board 30 may be attached to the display panel 10 such as by using an anisotropic conductive film. The circuit board 30 may be a flexible film, such as a flexible printed circuit board ("FPCB"), a printed circuit board ("PCB") or a chip on film ("COF"). The display panel 10 may receive a signal from outside the display panel 10, such as from the circuit board 30.

Referring to FIGS. 2 and 3, a protective film PF (e.g., protective layer) may be disposed under the display panel 10. The protective film PF may face the driving circuit 20 with the upper surface of the display panel 10 therebetween.

The protective film PF may include a first protective film PF1 (e.g., first protective layer pattern) corresponding to the main area MR and a second protective film PF2 (e.g., second protective layer pattern) corresponding to the sub area SR.

The first protective film PF1 may be exclusively disposed only in the main area MR. That is, the first protective film PF1 may terminate at a boundary between the main area MR and the bending area BR so as to not overlap the bending area BR or the sub area SR.

The second protective film PF2 may terminate at a boundary between the sub area SR and the bending area BR so as to be exclusively disposed only in the sub area SR. That is, the second protective film PF2 may not overlap the main area MR or the bending area BR.

An adhesive member (not shown) may be further disposed between the protective films PF1 and PF2, and a lower surface of the display panel 10 which is opposite to the display surface furthest along the Z-axis direction. Through the adhesive member, the first protective film PF1 may be attached to the display panel 10 at the main area MR, and the second protective film PF2 may be attached to the display panel at the sub area SR.

The first protective film PF1 and the second protective film PF2 may include or be formed of a same material. In an embodiment, for example, the first protective film PF1 and the second protective film PF2 may include at least one of polyethylene terephthalate ("PET"), polybutylene terephthalate ("PBT"), polysilane, polysiloxane, polysilazane, polycarbosilane, polyacrylate, polymethacrylate, polymethylacrylate, polymethylmethacrylate, polyethylacrylate, polyethylmethacrylate, cyclic olefin copolymer ("COC"), cyclic olefin polymer ("COP"), polyethylene ("PE"), polypropylene ("PP"), polyimide ("PI"), polymethyl methacrylate ("PMMA"), polystyrene ("PS"), polyacetal ("POM"), polyether ether ketone ("PEEK"), polyester sulfone ("PES"), polytetrafluoroethylene ("PTFE"), polyvinyl chloride ("PVC"), polycarbonate ("PC"), polyvinylidene fluoride ("PVDF"), perfluoroalkyl polymer ("PFA"), and styrene acrylonitrile copolymer ("SAN"), but is not necessarily limited thereto. The first protective film PF1 and the second protective film PF2 may be in a same layer of the display device 1. As being in a same layer, elements may be respective portions of a same material layer.

The display panel 10 which is unbent or flat disposes the first protective film PF1 and the second protective film PF2 spaced apart from each other along the Y-axis direction with the bending area BR therebetween (refer to FIG. 2). In FIG.

3, the first protective film PF1 and the second protective film PF2 spaced apart from each other in a direction along the display panel 10. That is, the first protective film PF1 and the second protective film PF2 are disconnected from each other at the bending area BR.

The display panel 10 which is bent disposes the first protective film PF1 and the second protective film PF2 overlapping each other along the third direction (Z-axis direction) (refer to FIG. 3).

An adhesive layer PSA (e.g., adhesive pattern) may be disposed between the first protective film PF1 and the second protective film PF2 which overlap each other along the thickness direction of the display device 1 which is bent. In an embodiment, for example, the adhesive layer PSA may be a pressure sensitive adhesive. The adhesive layer PSA may serve to bond the first protective film PF1 and the second protective film PF2 to each other in the display device 1 which is bent. Therefore, mechanical stability of a bending structure of the display device 1 may be improved at the end portion of the display device 1 which is bent at the bending area BR. A first surface of the adhesive layer PSA may be in contact with the first protective film PF1, and a second surface of the adhesive layer PSA which is opposite to the first surface thereof may be in contact with the second protective film PF2. As being in contact, elements may form an interface therebetween.

Figure 4:
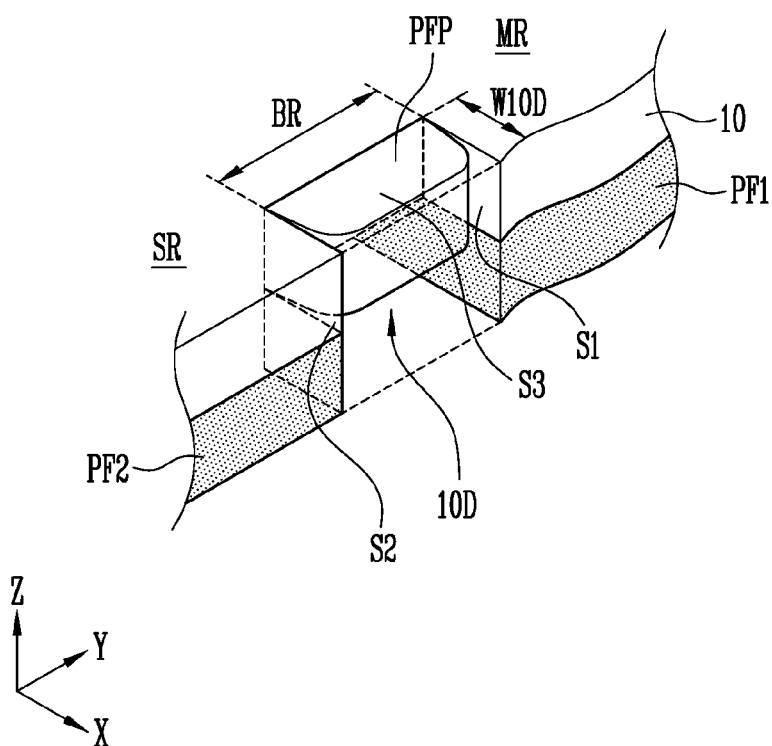
FIG. 4 is an enlarged perspective view of an embodiment of a recess portion of a bending area.

FIG. 4 is an enlarged perspective view of an embodiment of the recess portion 10D at the bending area BR.

Referring to FIG. 4, a side surface of the bending area BR may be defined by a side surface of the display panel 10 at the recess portion 10D. The recess portion 10D may be disposed on a first side (or left side) and a second side (or right side) of the bending area BR which oppose each other, and may be symmetric with respect to a center of the bending area BR along the Y-axis direction. The recess portion 10D positioned on the right side (or at the first direction (X-axis direction) side) with respect to the center of the display panel 10, will be described with reference to FIG. 4.

The recess portion 10D may be an area of the display panel 10 which is recessed in a direction opposite to the first direction (X-axis direction) from an outer side surface of the main area MR and an outer side surface of the sub area SR which are furthest along the X-axis direction. That is, the outer side surface of the display panel 10 at the recess portion 10D may be disposed inside the outer side surface of the main area MR and the outer side surface of the sub area SR.

The recess portion 10D may include a first surface S1, a second surface S2 facing the first surface S1, and a third surface S3 disposed between the first surface S1 and the second surface S2. The display panel 10 defines each of the first surface S1, the second surface S2 and the third surface S3. In an embodiment, the first surface S1 is defined by a side surface of the main area MR of the display panel 10, the second surface S2 is facing the first surface S1 and is defined by a side surface of the sub area SR of the display panel 10, and the third surface S3 is extended between the first surface S1 and the second surface S2 and is defined by an outer side surface of the bending area BR of the display panel 10.

The first surface S1 of the recess portion 10D may be positioned at a boundary between the main area MR and the bending area BR. The first surface S1 may be a side surface of the main area MR which faces the sub area SR. The first surface S1 of the recess portion 10D may be a surface extending in a direction opposite to the first direction (X-axis direction), from the outer side surface of the main area MR.

The second surface S2 of the recess portion 10D may be positioned at a boundary between the bending area BR and the sub area SR. The second surface S2 may be a side surface of the sub area SR which faces the main area MR. The second surface S2 of the recess portion 10D may be a surface extending in the direction opposite to the first direction (X-axis direction), from the outer side surface of the sub area SR.

The third surface S3 of the recess portion 10D may be a surface of the display panel 10 which is furthest along the direction opposite to the X-axis direction at the bending area BR. The third surface S3 extends along the second direction (Y-axis direction), from one end of the first surface S1 to one end of the second surface S2. Referring to FIG. 4, for example, an outer end of the first surface S1 and an outer end of the second surface S2 may meet the outer side surface of the main area MR and the outer side surface of the sub area SR, respectively. An inner end of the first surface S1 and an inner end of the second surface S2 may be opposite to the outer ends thereof. Opposing ends of the third surface S3 along the Y-axis direction meet the inner end of the first surface S1 and the inner end of the second surface S2, respectively.

In FIG. 4, the third surface S3 perpendicular to the first surface S1 and/or the second surface S2 is illustrated, but is not necessarily limited thereto. That is, the first surface S1 and/or the second surface S2 may have an inclination angle relative to the third surface S3. In an embodiment, for example, the recess portion 10D may have a trapezoidal shape in a plane defined by the X-axis direction and the Y-axis direction, in which a dimension (e.g., length) of the recess portion 10D along the Y-axis direction decreases in the direction opposite to the first direction (X-axis direction). In an embodiment, an angle between the first surface S1 and/or the second surface S2, and the third surface S3, respectively, may be an obtuse angle. In addition, the first surface S1, the second surface S2 and the third surface S3 may be implemented as curved surfaces. These surfaces may be curved within the plane defined by the X-axis direction and the Y-axis direction.

A width W10D of the recess portion 10D along the X-axis direction may be about 400 nanometers (nm) to about 800 nm. The width W10D of the recess portion 10D may be defined as a distance along the first direction (X-axis direction) from the outer side surface of the main area MR and/or the outer side surface of the sub area SR, to the third surface S3. The width W10D of the recess portion 10D may be substantially the same as a width of the first surface S1 along the first direction (X-axis direction). In addition, the width W10D of the recess portion 10D may be substantially the same as a width of the second surface S2 along the first direction (X-axis direction).

Since the outer side surface of the display panel 10 at the bending area BR I includes the recess portion 10D, the defect due to a protrusion portion PFP may be reduced or effectively prevented even though the protrusion portion PFP generated extended from the outer side surface of the display panel 10 at the bending area BR, is not physically removed from a remainder of the display panel 10. Detailed description thereof will be given with reference to FIG. 5.

Figure 5:
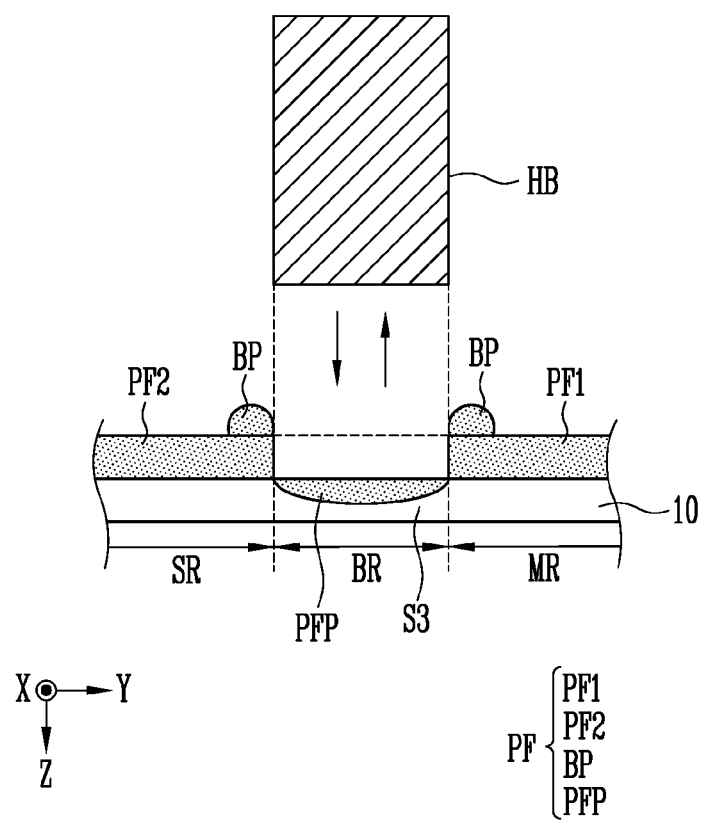
FIG. 5 is a cross-sectional view illustrating an embodiment of a process of removing a protective film from the bending area.

FIG. 5 is a cross-sectional view of an embodiment of a process of removing a protective film portion at the bending area BR.

Referring to FIG. 5, in order to easily bend the display panel 10, a portion of the protection film PF provided or formed at the bending area BR may be removed such as by using a heat block HB. Accordingly, the bending area BR of the display panel 10 may be exposed to outside the protective film PF, and the display panel 10 may be easily bendable at the planar area from which the portion of the protective film PF is removed.

Referring to FIG. 5, when the protective film PF is provided on a lower surface of the display panel 10 which is opposite to the upper surface or display surface thereof, the protective film PF may be disposed on an entirety of the lower surface of the display panel 10. As the portion of the protective film PF corresponding to the bending area BR is removed by the heat block HB, the first protective film PF1 and the second protective film PF2 spaced apart from each other with the bending area BR interposed therebetween, may be provided or formed. The heat block HB is a heating element which applies heat to the protective film PF such as to melt a material of the protective film PF. The heat block HB may remove a portion of the protective film PF by melting the protective film PF provided or formed on the display panel 10 at the bending area BR.

In a process of melting the protective film PF by the heat block HB, a melted portion of the protective film PF may move along the bending area BR. In an embodiment, for example, the melted portion of the protective film PF may move to the main area MR and/or the sub area SR. Accordingly, a bump BP protruding in a direction opposite to the third direction (Z-axis direction) may be provided or formed on a remaining portion of the first protective film PF1 and/or the second protective film PF2. The bump BP may have a shape protruding from one surface of the first protective film PF1 and/or the second protective film PF2. The bump BP may protrude from a lower surface of the first protective film PF1 and/or the second protective film PF2 which is furthest from the display panel 10. The bump BP may correspond to a boundary between the bending area BR, and the sub area SR and/or the main area MR, respectively.

In addition, the melted portion of the protective film PF may be displaced from a lower surface of the display panel 10 to extend along an outer side surface of the display panel 10, at the bending area BR. Accordingly, a protrusion portion PFP (or a tip) protruding in the first direction (X-axis direction) or in the direction opposite to the first direction (X-axis direction) may be provided or formed from the outer side surface of the display panel 10 at the bending area BR. The first protective film PF1, the second protective film PF2, the bump BP and the protrusion portion PFP may be respective portions of a same material layer, e.g., the protective film PF.

In general, the protrusion portion PFP may be separated from a remainder of the display panel 10 due to interference with another mechanism when the display panel 10 is bent or assembled. The generally separated form of the protrusion portion PFP may act as a foreign substance relative to the display panel 10 and cause a defect. When the protrusion portion PFP is actively removed through physical pressurization, a fine crack or the like may occur in the display panel 10, and thus, a life of the display panel 10 may be greatly reduced.

According to one or more embodiment of the display device 1, since the bending area BR includes the recess portion 10D, a defect due to the protrusion portion PFP may be reduced or effectively prevented, even though the protrusion portion PFP that is generated at the side surface of the bending area BR remains protruded from the display panel 10 (e.g., is not physically removed). Referring again to FIGS. 1 and 4, for example, the protrusion portion PFP may be provided or formed within the recess portion 10D at the bending area BR. The protrusion portion PFP may be provided or formed extended from the third surface S3 of the recess portion 10D. Accordingly, separation of the protrusion portion PFP due to interference with another mechanism when the display panel 10 is bent or assembled may be reduced or effectively prevented. That is, even though the protrusion portion PFP remains at the recess portion 10D, the defect due to the protrusion portion PFP may be reduced or effectively prevented.

Figure 6:
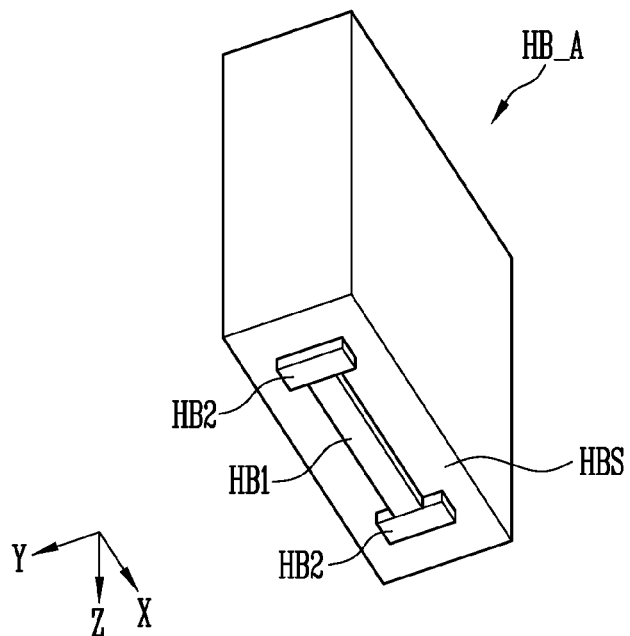
FIGS. 6 to 8 are respectively perspective views of an embodiment of a heat block of FIG. 5.
Figure 7:
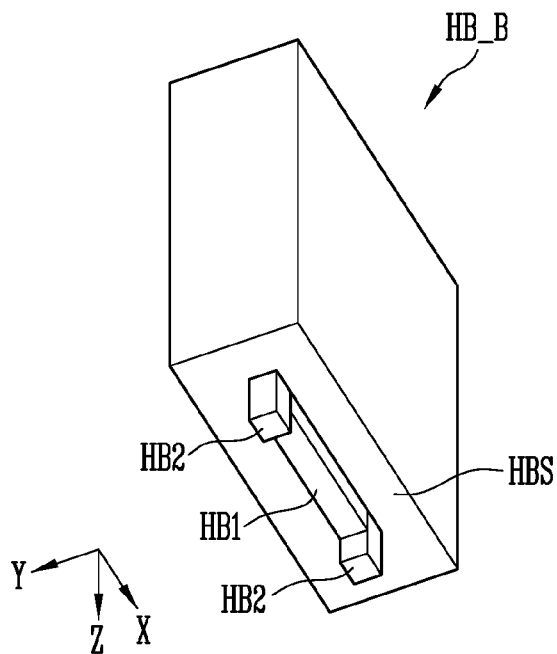
Figure 8:
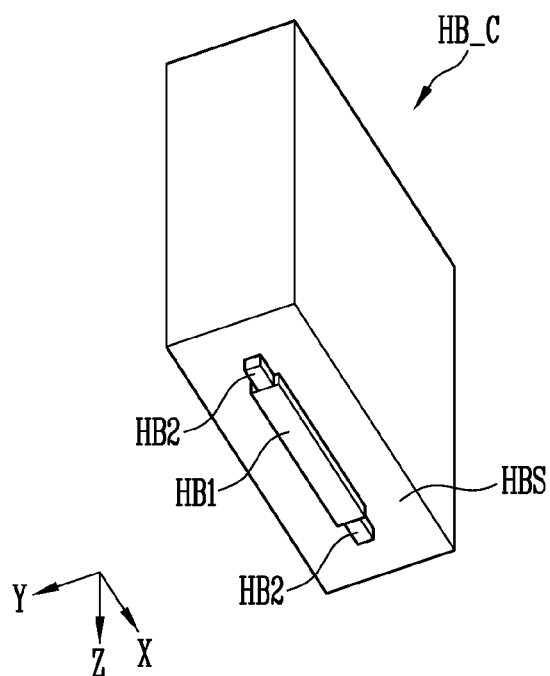

FIGS. 6 to 8 are respective perspective views of an embodiment of the heat block HB of FIG. 5.

Referring to FIGS. 6 to 8, the heat blocks HB_A, HB_B and HB_C may include a process surface HBS (e.g., processing surface) that is faceable with a process target such as the protective film PF. The heat block HB_A may include process portions disposed on or corresponding to the process surface HBS.

The process portions may include a first process portion HB1 and a second process portion HB2 provided in plurality (e.g., a plurality of second process portions HB2) respectively disposed at opposing ends of the first process portion HB1.

The first process portion HB1 may have a thickness extended along the Z-axis direction, a length extended along the X-axis direction and a width extended along the first direction (X-axis direction). The thickness and width of the first process portion HB1 may be adjusted in consideration of the thickness of the protective film PF and/or the width of the bending area BR of the display panel 10.

Each of the plurality of second process portions HB2 may be disposed to be adjacent to an opposing end of the first process portion HB1. The first process portion HB1 and the plurality of second process portions HB2 may be in order along the first direction (X-axis direction). The plurality of second process portions HB2 may have various shapes in a top plan view (e.g., planar shapes).

Each of the plurality of second process portions HB2 may have a thickness extended along the Z-axis direction, a width extended along the X-axis direction and a length extended along the first direction (X-axis direction). Referring to FIG. 6, for example, a thickness of the plurality of second process portions HB2 along the third direction (Z-axis direction) may be substantially the same as the thickness of the first process portion HB1 along the third direction (Z-axis direction). A dimension (e.g., length) of the plurality of second process portions HB2 along the second direction (Y-axis direction) may be greater than a dimension (e.g., width) of the first process portion HB1 along the second direction (Y-axis direction).

Referring to FIG. 7, the thickness of the plurality of second process portions HB2 along the third direction (Z-axis direction) may be greater than the thickness of the first process portion HB1 along the third direction (Z-axis direction). That is, the plurality of second process portions HB2 protrude further from the process surface HBS than the first process portion HB1. A dimension (e.g., width) of the plurality of second process portions HB2 along the second direction (Y-axis direction) may be substantially the same as a dimension (e.g., width) of the first process portion HB1 along the second direction (Y-axis direction).

Figure 9:
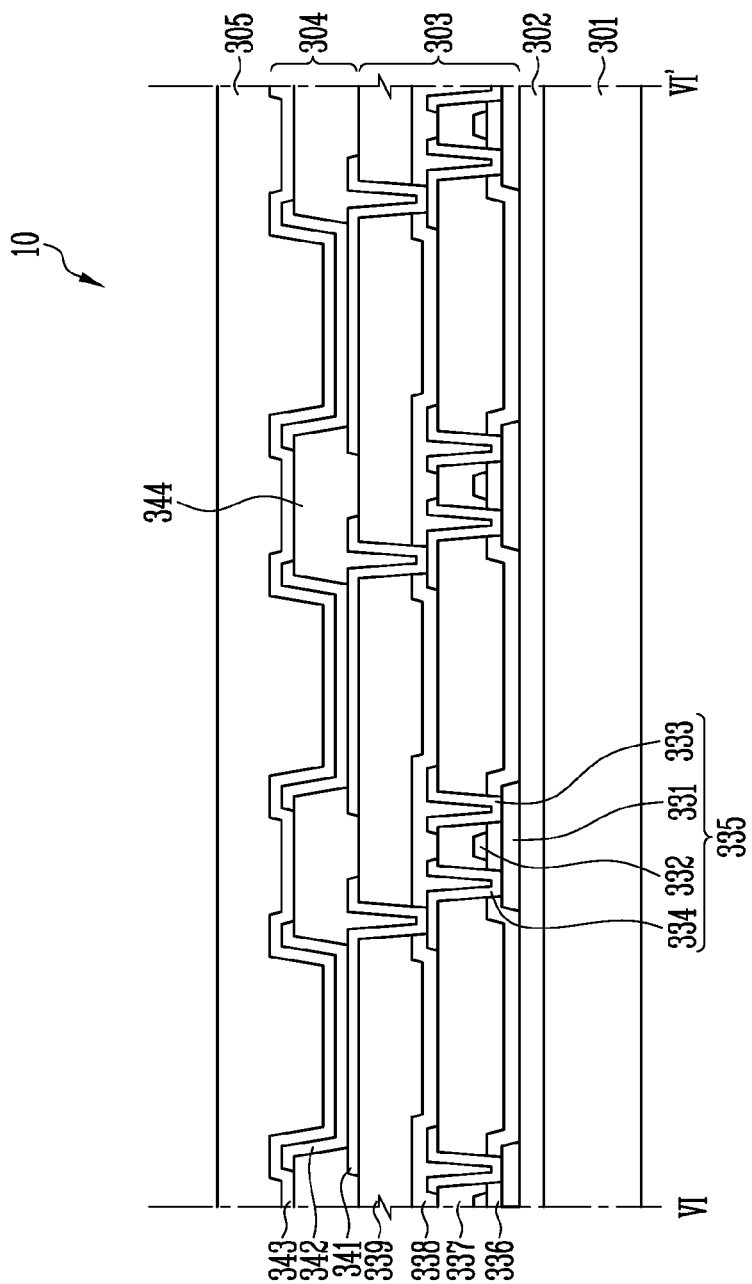
FIG. 9 is a cross-sectional view taken along line VI-VI' of FIG. 1.

Referring to FIG. 9, the thickness of the plurality of second process portions HB2 along the third direction (Z-axis direction) may be substantially the same as the thickness of the first process portion HB1 along the third direction (Z-axis direction). A dimension (e.g., width) of the plurality of second process portions HB2 along the second direction (Y-axis direction) may be less than a dimension (e.g., width) of the first process portion HB1 along the second direction (Y-axis direction).

Hereinafter, a cross-sectional structure of the display panel 10 will be described in detail.

FIG. 9 is a cross-sectional view taken along line VI-VI' of FIG. 1.

Referring to FIG. 9, the display panel 10 may include a substrate 301, a buffer layer 302, a thin film transistor layer 303 (e.g., circuit layer), a light emitting element layer 304 (e.g., display element layer), and a thin film encapsulation layer 305 (e.g., encapsulation layer).

The substrate 301 may be a rigid substrate or a flexible substrate which is bendable, foldable, rollable, and the like. The substrate 301 may include or be formed of an insulating material such as glass, quartz or polymer resin. An example of a polymer material may be polyethersulphone ("PES"), polyacrylate ("PA"), polyarylate ("PAR"), polyetherimide ("PEI"), polyethylenenaphthalate ("PEN"), polyethylene terephthalate ("PET"), polyphenylenesulfide ("PPS"), polyallylate, polyimide ("PI"), polycarbonate ("PC"), cellulose triacetate ("CAT"), cellulose acetate propionate ("CAP"), or a combination thereof. The substrate 301 may include a metal material.

The buffer layer 302 may be disposed on the substrate 301. The buffer layer 302 may be disposed on the substrate 301 to protect a thin film transistor 335 provided in plurality (e.g., thin film transistors 335) and light emitting elements from moisture penetrating through the substrate 301 which is vulnerable to moisture permeation. The buffer layer 302 may include or be formed of a plurality of inorganic films that are stacked. In an embodiment, for example, the buffer layer 302 may include or be formed of multiple films in which one or more inorganic films of silicon oxide film (SiOx), silicon nitride film (SiNx), and SiON are alternately stacked. In an embodiment, the buffer layer 302 may be omitted.

The thin film transistor layer 303 may be disposed on the buffer layer 302. The thin film transistor layer 303 may include the thin film transistors 335, a gate insulating film 336 (e.g., first insulating layer), an interlayer insulating film 337 (e.g., second insulating layer), a protective layer 338 (e.g., third insulating layer) and a planarization film 339 (e.g., fourth insulating layer).

Each of the thin film transistors 335 may include an active layer 331, a gate electrode 332, a source electrode 333 and a drain electrode 334. FIG. 9 illustrates an embodiment in which the thin film transistor 335 is provided or formed in an upper gate (top gate) method in which the gate electrode 332 is positioned above the active layer 331, but the disclosure is not limited thereto. That is, the thin film transistors 335 may be provided or formed in a lower gate (bottom gate) method in which the gate electrode 332 is positioned under the active layer 331 or a double gate method in which the gate electrode 332 is disposed both above and under the active layer 331.

The active layer 331 may be disposed on the buffer layer 302. The active layer 331 may include or be formed of a silicon-based semiconductor material or an oxide-based semiconductor material. A light blocking layer (not shown) for blocking external light incident to the active layer 331 may be further disposed between the buffer layer 302 and the active layer 331.

The gate insulating film 336 may be disposed on the active layer 331. The gate insulating film 336 may include or be formed of an inorganic film, for example, a silicon oxide film (SiOx), a silicon nitride film (SiNx), or multiple films thereof.

The gate electrode 332 and a gate line (e.g., gate signal line) may be disposed on the gate insulating film 336. The gate electrode 332 and the gate line may be provided or formed of a single layer or multiple layers of any one of molybdenum (Mo), aluminum (Al), chromium (Cr), gold (Au), titanium (Ti), nickel (Ni), neodymium (Nd), and copper (Cu), or an alloy thereof. The gate electrode 332 and the gate line may be in a same layer as each other.

The interlayer insulating film 337 may be disposed on the gate electrode 332 and the gate line. The interlayer insulating film 337 may include or be formed of an inorganic film, for example, a silicon oxide film (SiOx), a silicon nitride film (SiNx), or multiple films thereof.

The source electrode 333, the drain electrode 334 and a data line (e.g., data signal line) may be provided or formed on the interlayer insulating film 337. Each of the source electrode 333 and the drain electrode 334 may be connected to the active layer 331, through a contact hole passing through each of the gate insulating film 336 and the interlayer insulating film 337. The source electrode 333, the drain electrode 334 and the data line may be formed of a single layer or multiple layers of any one of molybdenum (Mo), aluminum (Al), chromium (Cr), gold (Au), titanium (Ti), nickel (Ni), neodymium (Nd), and copper (Cu), or an alloy thereof. The source electrode 333, the drain electrode 334 and the data line may be in a same layer as each other.

The protective layer 338 may be disposed on the source electrode 333, the drain electrode 334 and the data line to insulate the thin film transistor 335 from other layers within the display panel 10. The protective layer 338 may include or be formed of an inorganic film, for example, a silicon oxide film (SiOx), a silicon nitride film (SiNx), or multiple films thereof.

The planarization film 339 for planarizing a step difference due to layers of the thin film transistor 335, may be disposed on the protective layer 338. The planarization film 339 may include or be formed of an organic film such as an acryl resin, an epoxy resin, a phenolic resin, a polyamide resin, a polyimide resin, or the like.

The light emitting element layer 304 may be disposed on the thin film transistor layer 303. The light emitting element layer 304 may include light emitting elements as display elements, and a pixel definition film 344 (e.g., pixel definition layer).

The light emitting elements and the pixel definition film 344 may be disposed on the planarization film 339. The light emitting element may be an organic light emitting element. In this case, the light emitting element may include a first electrode 341, a light emitting layer 342 and a second electrode 343.

The first electrode 341 may be disposed on the planarization film 339. The first electrode 341 may be connected to the drain electrode 334 of the thin film transistor 335, at a contact hole passing through each of the protective layer 338 and the planarization film 339. The first electrode 341 may be an electrode pattern having a discrete dimension in a direction along the substrate 301.

The pixel definition film 344 may be disposed to cover an edge of the first electrode 341 on the planarization film 339 to partition the pixels PX along the substrate 301. That is, the pixel definition film 344 may serve to define light emission areas of the pixels PX. Each of the pixels PX may indicate a planar area where the first electrode 341, the light emitting layer 342 and the second electrode 343 are sequentially stacked in a direction from the substrate 301. A hole from the first electrode 341 and an electron from the second electrode 343 are combined to each other in the light emitting layer 342 to emit light at a light emission area of a pixel PX.

The light emitting layer 342 may be disposed on the first electrode 341 and the pixel definition film 344. The light emitting layer 342 may be an organic light emitting layer. The light emitting layer 342 may emit one of red light, green light and blue light. Alternatively, the light emitting layer 342 may be a white light emitting layer that emits white light. In this case, the light emitting layer 342 may have a structure in which a red light emitting layer, a green light emitting layer, and a blue light emitting layer are stacked. In an embodiment, the light emitting layer 342 may be a light emitting pattern having a discrete dimension in a direction along the substrate 301. In an embodiment, the light emitting layer 342 may be commonly disposed relative to more than one of the pixels PX. In this case, the display panel 10 may further include a separate color filter for displaying red, green and blue light.

The light emitting layer 342 may include a hole transporting layer, a light emitting layer and an electron transporting layer. In addition, the light emitting layer 342 may include or be formed in a tandem structure of two or more stacked layers, and in this case, a charge generation layer may be provided or formed between the stacked layers.

The second electrode 343 may be disposed on the light emitting layer 342. The second electrode 343 may be disposed to cover the light emitting layer 342. The second electrode 343 may be a common layer disposed corresponding to more than one of the pixels PX.

When the light emitting element layer 304 is provided or formed in a top emission method in which light is emitted in an upward direction away from the substrate 301, the first electrode 341 may include or be formed of a metal material of which reflectance is high, such as a stacked structure of aluminum and titanium (Ti/Al/Ti), a stacked structure of aluminum and indium tin oxide ("ITO") (ITO/Al/ITO), an APC alloy, and a stacked structure of an APC alloy and ITO (ITO/APC/ITO). The APC alloy is an alloy of silver (Ag), palladium (Pd), and copper (Cu). In addition, the second electrode 343 may include or be formed of a transparent metal material (for example, a transparent conductive material ("TCM")) such as ITO or indium zinc oxide ("IZO"), which may transmit light, or a semi-transmissive metal material (for example, a semi-transmissive conductive material) such as magnesium (Mg), silver (Ag), or an alloy of magnesium (Mg) and silver (Ag). When the second electrode 343 includes or is formed of the semi-transmissive metal material, light emission efficiency may be increased by a micro cavity defined within the display panel 10.

When the light emitting element layer 304 is provided or formed in a bottom emission method in which light is emitted in a downward direction toward the substrate 301, the first electrode 341 may include or be formed of a transparent metal material (for example, a transparent conductive material ("TCM")) such as ITO or IZO, or a semi-transmissive metal material (for example, a semi-transmissive conductive material) such as magnesium (Mg), silver (Ag), or an alloy of magnesium (Mg) and silver (Ag). The second electrode 343 may include or be formed of a metal material of which reflectance is high, such as a stacked structure of aluminum and titanium (Ti/Al/Ti), a stacked structure of aluminum and ITO (ITO/Al/ITO), an APC alloy, and a stacked structure of an APC alloy and ITO (ITO/APC/ITO). When the first electrode 341 includes or is formed of the semi-transmissive metal material, light emission efficiency may be increased by a micro cavity defined within the display panel 10.

The thin film encapsulation layer 305 may be disposed on the light emitting element layer 304. The thin film encapsulation layer 305 may serve to prevent oxygen or moisture from penetrating into the light emitting layer 342 and/or the second electrode 343. To this end, the thin film encapsulation layer 305 may include at least one inorganic film. The inorganic film may include or be formed of silicon nitride, aluminum nitride, zirconium nitride, titanium nitride, hafnium nitride, tantalum nitride, silicon oxide, aluminum oxide or titanium oxide.

In addition, the thin film encapsulation layer 305 may further include at least one organic film. The organic film may be provided or formed to have a sufficient thickness so as to reduce or effectively prevent particles from penetrating the thin film encapsulation layer 305 and being inserted into the light emitting layer 342 and/or the second electrode 343. The organic film may include any one of epoxy, acrylate and urethane acrylate.

Although not shown in the drawings, a sensing layer (e.g., input sensing layer) may be further disposed on the thin film encapsulation layer 305. Since the sensing layer is directly disposed on the thin film encapsulation layer 305, a thickness of the display device 1 may be reduced in comparison where a separate sensing panel including the sensing layer is attached on the thin film encapsulation layer 305. The sensing layer may include touch electrodes for sensing a touch from outside the sensing layer in a capacitive method, and touch lines which connect pads and the touch electrodes to each other.

According to one or more embodiment of the display device 1 described above, even though the protrusion portion PFP (or the tip) is generated on the outer side surface of the display panel 10 at the bending area BR, since the protrusion portion PFP may be disposed in the recess portion 10D of the bending area BR, separation of the protrusion portion PFP from the display panel 10 due to interference with another mechanism when the display panel 10 is bent or assembled, may be reduced or effectively prevented. That is, even though the protrusion portion PFP is not physically removed from the display panel 10, the defects due to the protrusion portion PFP may be reduced or effectively prevented.

In the following embodiment, the same configuration as the configuration that is already described will be referred to by the same reference numeral, and repetitive description will be omitted or simplified.

Figure 10:
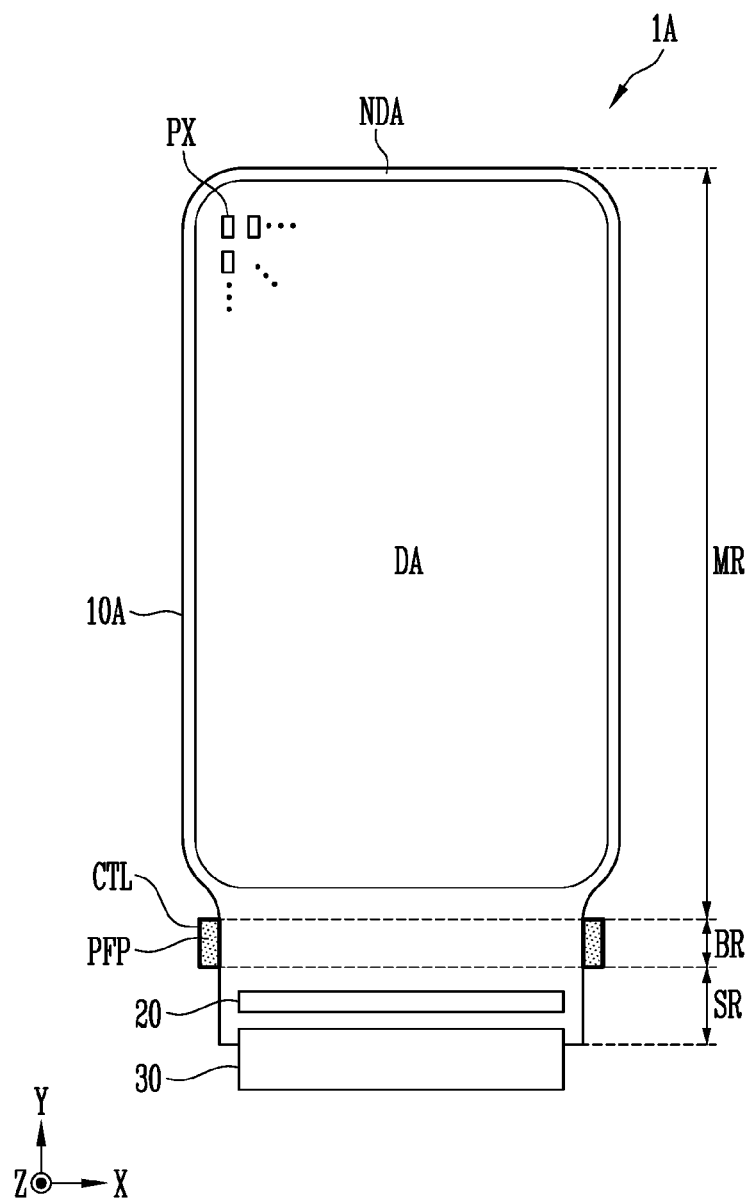
FIG. 10 is a top plan view of an embodiment of a display device.
Figure 11:
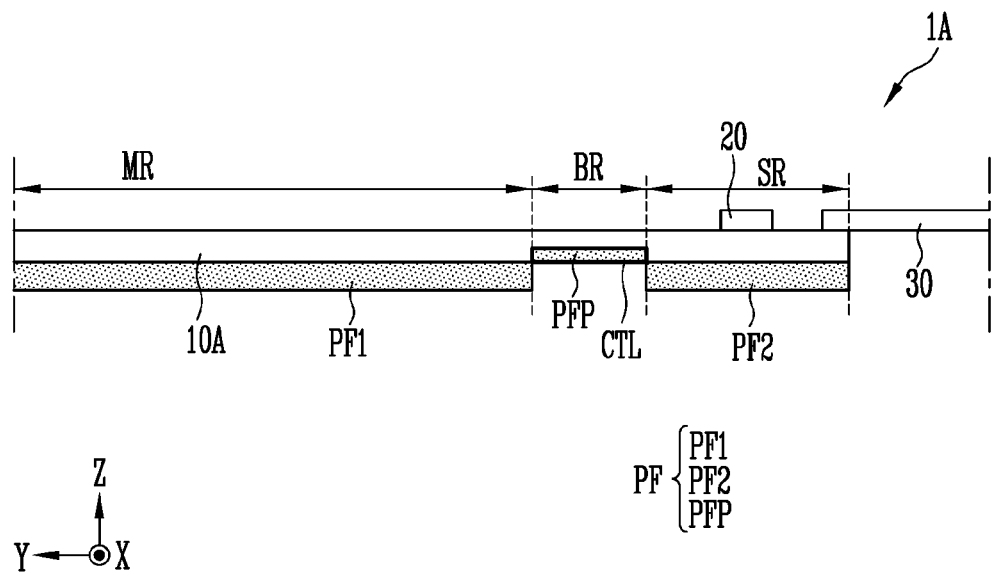
FIG. 11 is a cross-sectional side view of the display device of FIG. 10 which is unbent.
Figure 12:
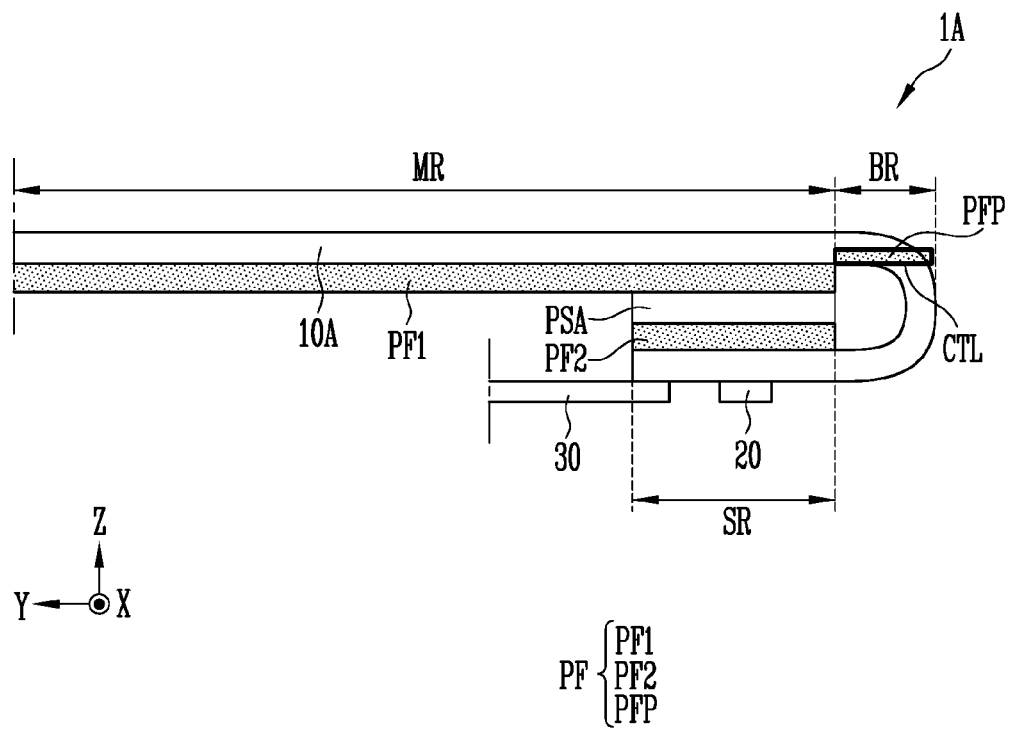
FIGS. 12 to 14 are respectively cross-sectional side views of the display device of FIG. 10 which is bent.
Figure 13:
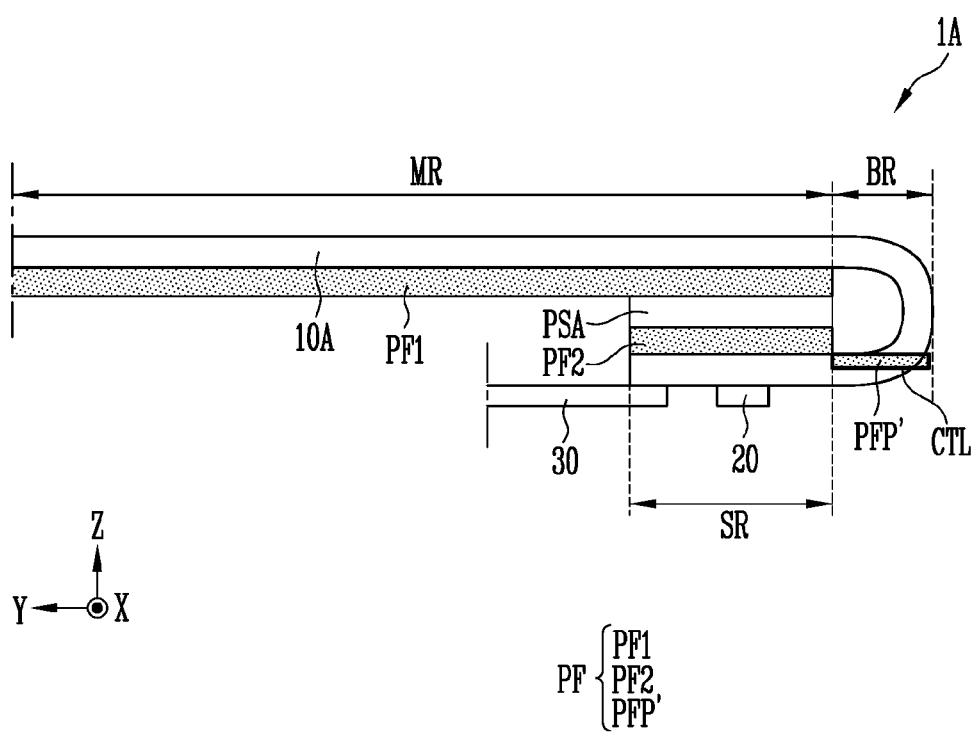
Figure 14:
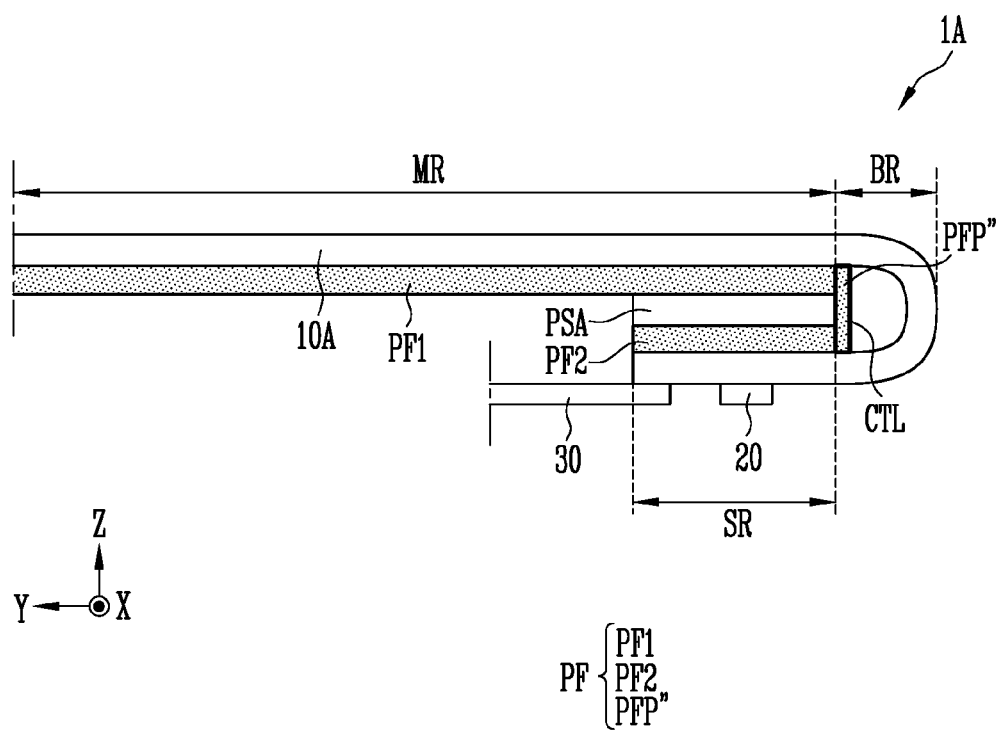

FIG. 10 is a top plan view of an embodiment of the display device 1A. FIG. 11 is a cross-sectional side view of the display device 1A of FIG. 10 which is unbent or flat. FIGS. 12 to 14 are cross-sectional side views of the display device 1A of FIG. 10 which is bent.

Referring to FIG. 10, the display device 1A is different from the embodiment of FIGS. 1 to 9 in that the protrusion portion PFP is fixed to the outer side surface of a display panel 10A at the bending area BR, by a coating layer CTL.

In FIG. 10, the display device 1A includes a main area MR including a display area DA, a bending area BR at which the display panel 10A is bendable, and a sub area SR, in order. Referring to FIGS. 10 and 11, each of the main area MR, the bending area BR and the sub area SR include an upper surface furthest along the Z-axis direction, a lower surface which is opposite to the upper surface, and an outer side surface connecting the upper surface to the lower surface. The display device 1A further includes a protective layer (e.g., protective film PF) facing the lower surface of the display panel 10A and extended along the display panel 10A, the protective layer including a protrusion portion PFP facing the outer side surface of the bending area BR and extended outwardly from the outer side surface of the bending area BR.

As described above, as the melted portion of the protective film PF is moved to the outer side surface of the display panel 10 at the bending area BR in the process of melting the protective film PF by the heat block HB, the protrusion portion PFP may be formed at the outer side surface of the display panel 10 the bending area BR. When the protrusion portion PFP is separated due to interference with another mechanism when display panel 10 is bent or assembled, the protrusion portion PFP which is separated from a remainder of the display panel 10 may act as a foreign substance around the display panel 10 and cause a defect. The display device 1A fixes the protrusion portion PFP to a display panel 10A by using the coating layer CTL, thereby reducing or effectively preventing damage to the display panel 10A due to separation of the protrusion portion PFP, and thereby increasing a life of the display panel 10A.

The coating layer CTL may cover the protrusion portion PFP. As covering the protrusion portion PFP, the coating layer CTL may be disposed on all outer surfaces of the protrusion portion PFP. The coating layer CTL may directly cover the protrusion portion PFP and may directly contact the outer surfaces of the protrusion portion PFP. In an embodiment, the coating layer CTL is extended along outer surfaces of the protrusion portion PFP. In FIG. 10, the coating layer CTL covers an entirety of the outer surface of the protrusion portion PFP, but is not necessarily limited thereto. In an embodiment, for example, the coating layer CTL may partially cover an area where the protrusion portion PFP contacts the display panel 10A.

The coating layer CTL may include a thermosetting and/or a photopolymer resin material. In an embodiment, for example, the coating layer CTL may include, bisphenol-based, ortho-Cresol novolac-based, polyfunctional epoxy, amine-based epoxy, heterocyclic containing epoxy, substituted epoxy, or naphthol-based epoxy as the thermosetting resin material, but is not necessarily limited thereto. In addition, the coating layer CTL may use an aromatic epoxy resin, an alicyclic epoxy resin, or a combination thereof as the photopolymer resin material. The aromatic epoxy resin may include biphenyl type, bisphenol A type, bisphenol F type, phenol novolak type, dicyclopentadiene type, epoxy resin, and the like but is not necessarily limited thereto.

Referring to FIG. 11, the display panel 10A which is unbent disposes the protrusion portion PFP on the outer side surface of the display panel 10A at the bending area BR. A first end of the protrusion portion PFP along the Y-axis direction may be disposed at the boundary between the bending area BR and the main area MR, and a second end of the protrusion portion PFP which is opposite to the first end thereof may be disposed at the boundary between the bending area BR and the sub area SR. In an embodiment, for example, the bending area BR includes a first side closest to a boundary between the main area MR and the bending area BR, and a second side which is opposite to the first side and closest to a boundary between the sub area SR and the bending area BR. The protrusion portion PFP includes a first end and a second end opposing each other, and the display panel 10A which is unbent provides the first end and the second end of the protrusion portion PFP attached to the outer side surface of the bending area BR at the first side and the second side thereof, respectively.

The protrusion portion PFP may be disposed between the first protective film PF1 and the second protective film PF2 in a direction along the display panel 10A (e.g., Y-axis direction). A thickness of the protrusion portion PFP may be smaller than a thickness of the first protective film PF1 and/or a thickness of the second protective film PF2. In an embodiment, for example, the display panel 10A includes a thickness direction defined in a direction from the upper surface of the display panel 10A to the lower surface of the display panel 10A (e.g., along the Z-axis direction). Each of the first protective film PF1, the second protective film PF2 and the protrusion portion PFP has a thickness along the thickness direction of the display panel 10A.

The protrusion portion PFP may include or be formed of the same material as the first protective film PF1 and/or the second protective film PF2, and be in a same layer therewith. In an embodiment, for example, the protrusion portion PFP may include at least one of polyethylene terephthalate ("PET"), polybutylene terephthalate ("PBT"), polysilane, polysiloxane, polysilazane, polycarbosilane, polyacrylate, polymethacrylate, polymethylacrylate, polymethylmethacrylate, polyethylacrylate, polyethylmethacrylate, cyclic olefin copolymer ("COC"), cyclic olefin polymer ("COP"), polyethylene ("PE"), polypropylene ("PP"), polyimide ("PI"), polymethyl methacrylate ("PMMA"), polystyrene ("PS"), polyacetal ("POM"), polyether ether ketone ("PEEK"), polyester sulfone ("PES"), polytetrafluoroethylene ("PTFE"), polyvinyl chloride ("PVC"), polycarbonate ("PC"), polyvinylidene fluoride ("PVDF"), perfluoroalkyl polymer ("PFA") and styrene acrylonitrile copolymer ("SAN"), but is not necessarily limited thereto.

The display panel 10A which is bent disposes the protrusion portion PFP partially separated from the display panel 10A. That is, the first end or the second end of the protrusion portion PFP may be separated from or relocated along the display panel 10A, or a side surface of the protrusion portion PFP may be separated from or relocated along the display panel 10A.

Referring to FIG. 12, for example, the first end of the protrusion portion PFP may be in contact with the display panel 10A at a first side of the bending area BR, and the second end of the protrusion portion PFP may be separated from the display panel 10A. The protrusion portion PFP may be removably attachable to the display panel 10A. That is, the display panel 10A which is bent provides the first end of the protrusion portion PFP attached to the outer side surface of the bending area BR at the first side thereof, and the second end of the protrusion portion PFP located at the first side of the bending area BR and further from the main area MR than the first end of the protrusion portion PFP.

The first end of the protrusion portion PFP may be disposed at the boundary between the bending area BR and the main area MR. The display panel 10A which is bent disposes the second end of the protrusion portion PFP detached from the display panel 10A and the protrusion portion PFP substantially parallel to the main area MR and/or the sub area SR. That is, the protrusion portion PFP does not correspond to the curvature of the display panel 10A at the bending area BR.

Referring to FIG. 13, for example, the first end of a protrusion portion PFP' may be separated from the display panel 10A, and the second end of the protrusion portion PFP' may be in contact with second side of the bending area BR. The second end of the protrusion portion PFP' may be disposed at the boundary between the bending area BR and the sub area SR. The display panel 10A which is bent disposes the first end of the protrusion portion PFP' detached from the display panel 10A and the protrusion portion PFP' substantially parallel to the main area MR and/or the sub area SR. That is, the display panel 10A which is bent provides the second end of the protrusion portion PFP attached to the outer side surface of the bending area BR at the second side thereof, and the first end of the protrusion portion PFP located at the second side of the bending area BR and further from the sub area SR then the second end.

Referring to FIG. 14, for example, the first end and the second end of a protrusion portion PFP" may be in contact with the display panel 10A at the bending area BR, and the side surface of the protrusion portion PFP" may be separated from the display panel 10A. The first end of the protrusion portion PFP" may be in contact with the first side of the bending area BR, and the second end of the protrusion portion PFP" may be in contact with the second side of the bending area BR. The display panel 10A which is bent disposes the side surface of the protrusion portion PFP detached from the display panel 10A and the protrusion portion PFP" substantially perpendicular to the main area MR and/or the sub area SR. That is, the display panel 10A which is bent provides the first end of the protrusion portion PFP attached to the outer side surface of the bending area BR at the boundary between the main area MR and the bending area BR, and the second end of the protrusion portion PFP attached to the outer side surface of the bending area BR at the boundary between the sub area SR and the bending area BR.

According to one or more embodiment of the display device 1A, since the protrusion portion PFP is removably attachable and fixable to the display panel 10A by using the coating layer CTL, separation of the protrusion portion PFP from a remainder of the display panel 10A due to interference with another mechanism when the display panel 10A is bent or assembled may be reduced or effectively prevented. Therefore, the damage of the display panel 10A due to the protrusion portion PFP may be reduced or effectively prevented and a life of the display panel 10A may be increased as described above.

Figure 15:
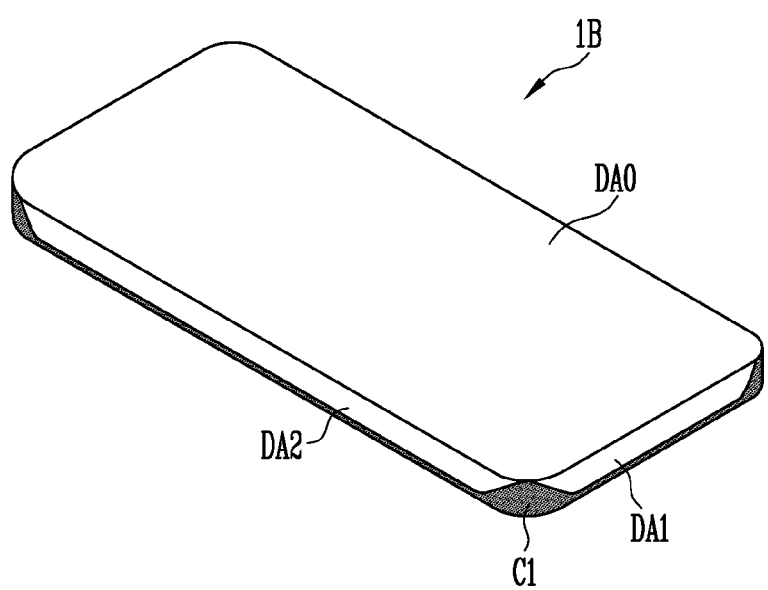
FIG. 15 is a perspective view of an embodiment of a display device.
Figure 16:
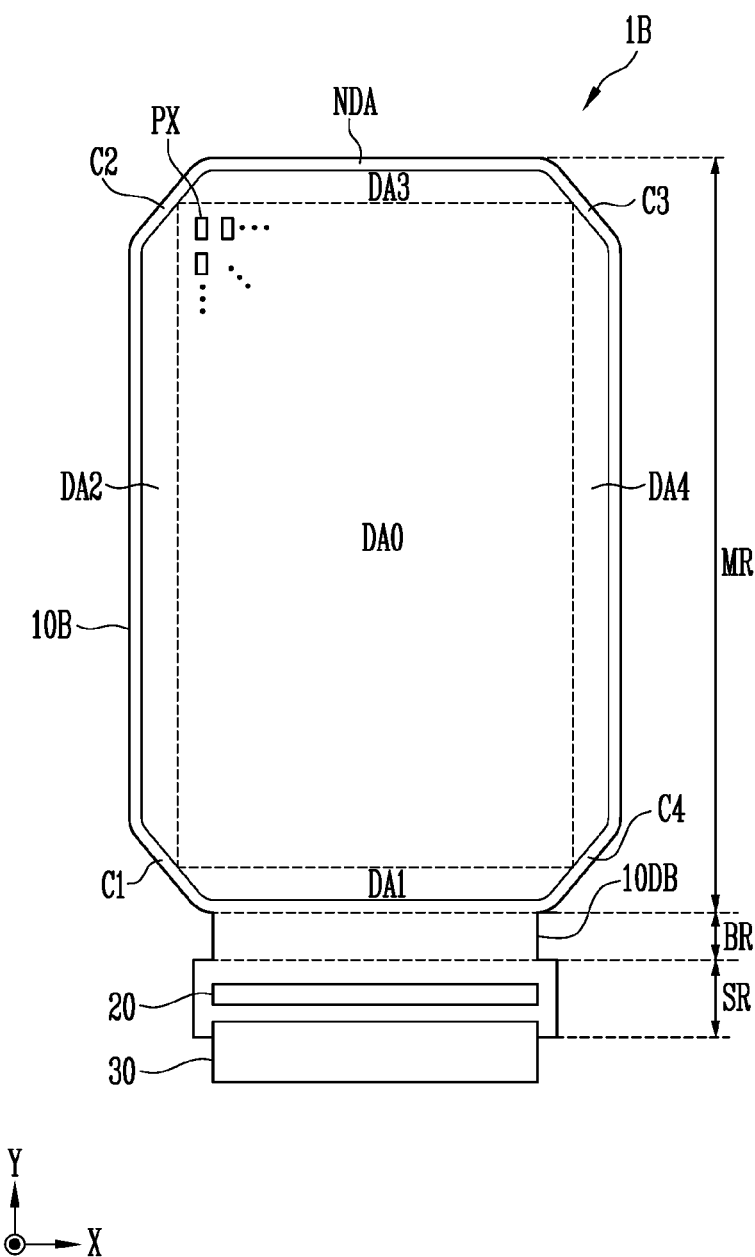
FIG. 16 is an exploded view of the display device of FIG. 15.
Figure 17:
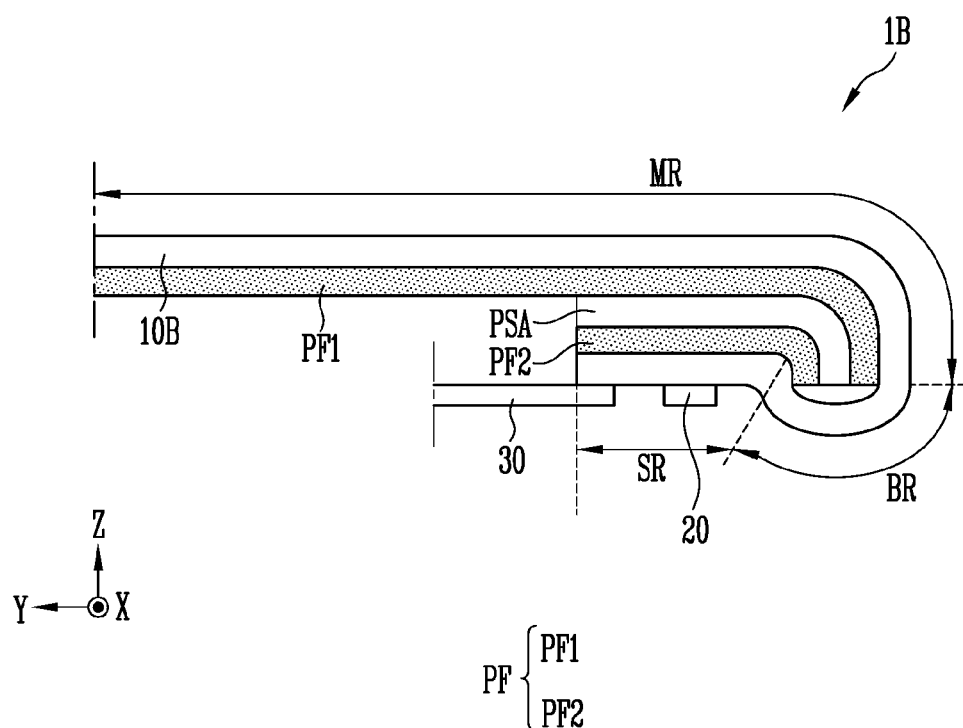
FIG. 17 is a side view of the display device of FIG. 16 after bending.

FIG. 15 is a perspective view of an embodiment of a display device 1B. FIG. 16 is a top plan view of display areas of the display device 1B of FIG. 15 which are in a same plane as each other (e.g., expanded view). FIG. 17 is a cross-sectional side view of the display device 1B of FIG. 16 which is bent.

Referring to FIGS. 15 to 17, the display device 1B is different from the embodiment of FIGS. 1 to 9 in that the main area MR includes a front display area DA0, side display areas DA1, DA2, DA3 and DA4, and corner areas C1, C2, C3 and C4.

The front display area DA0 and the side display areas DA1, DA2, DA3 and DA4 together may be the display area DA at which an image is not displayed. The corner areas C1, C2, C3 and C4 together may be the non-display area NDA at which the image is not displayed, and may be an area where the drivers for driving the plurality of pixels PX and various lines (not shown) which connect the pixels PX and the driver to each other, are provided.

The front display area DA0 may have a planar shape of a rectangle including two long sides extending along the second direction (Y-axis direction) and two short sides extending along the first direction (X-axis direction). However, the disclosure is not limited thereto, and a corner where the short side and the long side meet may have a rounded polygonal shape in the top plan view.

The side display areas DA1, DA2, DA3 and DA4 may include a first side display area DA1, a second side display area DA2, a third side display area DA3 and a fourth side display area DA4.

The first side display area DA1 may be a planar area extending along the direction opposite to the second direction (Y-axis direction) from a first side of the front display area DA0, the second side display area DA2 may be a planar area extending in the direction opposite to the first direction (X-axis direction) from a second side of the front display area DA0, the third side display area DA3 may be a planar area extending in the second direction (Y-axis direction) from a third side of the front display area DA0, and the fourth side display area DA4 may be a planar area extending in the first direction (X-axis direction) from a fourth side of the front display area DA0.

The first to fourth side display areas DA1, DA2, DA3, and DA4 may have substantially the same function or structure except for positions thereof. Hereinafter, a common feature of the first to fourth side display areas DA1, DA2, DA3, and DA4 will be described based on the first side display area DA1, and repetitive description thereof will be omitted.

The first side display area DA1 may extend outwardly from the first side of the front display area DA0, and may be bent in a direction opposite to the Z-axis direction, at an angle. In an embodiment, for example, the first side display area DA1 may be bent at an angle of about 90 degrees to about 150 degrees, with respect to the front display area DA0.

The first side display area DA1 may be connected to the bending area BR. The first side display area DA1 may connect the front display area DA0 to the bending area BR. As shown in FIG. 17, when a display panel 10B which is bent disposes the first side display area DA1 bent vertically with respect to the front display area DA0, the bending area BR may be bent twice vertically with respect to the front display area DA0 (that is, once extending from the main area MR and once at a boundary with the sub area SR, to be bent at an angle of 180° with respect to the front display area DA0). Therefore, the sub area SR positioned on one side of the bending area BR may be disposed under and corresponding to the front display area DA0 along a thickness direction of the front display area DA0. The sub area SR may overlap the front display area DA0 and may be disposed in a plane which is substantially parallel to a plane in which the front display area DA0 is disposed.

In a direction along the sides of the front display area DA0, the corner areas C1, C2, C3 and C4 may be positioned between the side display areas DA1, DA2, DA3 and DA4. The corner areas C1, C2, C3, and C4 may include first to fourth corner areas C1, C2, C3 and C4 respectively positioned between the first to fourth side display areas DA1, DA2, DA3 and DA4. The first to fourth corner areas c1, C2, C3, and C4 may be disposed adjacent to four corners of the display device 1B and corresponding to where a long side and a short side of the front display area DA0 meet. The first to fourth corner areas C1, C2, C3 and C4 may have substantially the same function or configuration except for positions thereof. Hereinafter, a common feature of the first to fourth corner areas C1, C2, C3 and C4 will be described based on the first corner area C1, and repetitive description thereof will be omitted.

The first corner area C1 may be positioned between the first side display area DA1 and the second side display area DA2. A first end of the first corner area C1 may be in contact with or meet the first side display area DA1, and a second end of the first corner area C1 may be in contact with or meet the second side display area DA2.

The first corner area C1 may curvedly extend from the front display area DA0 and may define a curvature with respect to the front display area DA0. The curvature formed by the first corner area C1 with the front display area DA0, may be greater than a curvature respectively formed by the first side display area DA1 and the second side display area DA2, each with respect to the front display area DA0.

The side surface of the display panel 10B at the bending area BR may include a recess portion 10DB recessed from outer side surfaces of the sub area SR. As described above for recess portion 10D, the recess portion 10DB may serve to prevent or minimize separation of the protrusion portion PFP (or tip) which may be generated on the outer side surface of the display panel at the bending area BR, due to interference with another mechanism when the display panel 10B is bent or assembled. Accordingly, even though the protrusion portion PFP is maintained attached to the display panel 10B (e.g., is not physically removed), damage of the display panel 10B due to the protrusion portion PFP may be reduced or effectively prevented and a life of the display panel 10B may be increased as described above.

Those skilled in the art will understand that the disclosure may be carried out in other specific forms without changing the technical spirit or essential characteristics thereof. Therefore, it should be understood that the above-described embodiments are illustrative and not restrictive in all features. The scope of the disclosure is defined by the following claims rather than the above detailed description, and it is intended that all changes and modifications drawn from the meaning and range of the claims and the equivalents thereof are included within the scope of the disclosure.

What is claimed is:

1. A display device comprising:
    a display panel including:
        a main area including a display area, a bending area at which the display panel is bendable, and a sub area, in order, and
        each of the main area, the bending area and the sub area including an upper surface, a lower surface which is opposite to the upper surface, and an outer side surface connecting the upper surface to the lower surface;
    a protective layer facing the lower surface and the outer side surface of the display panel, the protective layer including a protrusion portion facing the outer side surface of the bending area and extended outwardly from the outer side surface of the bending area; and
    a coating layer extended along an outer surface of the protrusion portion.

2. The display device according to claim 1, wherein the protective layer further includes:
    a first protective film extending along the lower surface of the main area; and
    a second protective film extending along the lower surface of the sub area.

3. The display device according to claim 2, wherein the first protective film, the second protective film and the protrusion portion are respective portions of a same material layer.

4. The display device according to claim 2, wherein
    the display panel further includes a thickness direction defined in a direction from the upper surface to the lower surface,
    each of the first protective film, the second protective film and the protrusion portion has a thickness along the thickness direction, and
    the thickness of the protrusion portion is smaller than the thickness of the first protective film and the thickness of the second protective film.

5. The display device according to claim 2, wherein the first protective film and the second protective film are disconnected from each other at the bending area.

6. The display device according to claim 1, wherein
    the bending area includes a first side closest to a boundary between the main area and the bending area, and a second side which is opposite to the first side and closest to a boundary between the sub area and the bending area,
    the protrusion portion includes a first end and a second end opposing each other,
    the display panel which is unbent provides the first end and the second end of the protrusion portion attached to the outer side surface of the bending area at the first side and the second side thereof, respectively, and
    the display panel which is bent provides:
        the first end of the protrusion portion attached to the outer side surface of the bending area at the first side thereof, and
        the second end of the protrusion portion located at the first side of the bending area and further from the main area than the first end of the protrusion portion.

7. The display device according to claim 1, wherein
    the bending area includes a first side closest to a boundary between the main area and the bending area, and a second side which is opposite to the first side and closest to a boundary between the sub area and the bending area,
    the protrusion portion includes a first end and a second end opposing each other,
    the display panel which is unbent provides the first end and the second end of the protrusion portion attached to the outer side surface of the bending area at the first side and the second side thereof, respectively, and
    the display panel which is bent provides:
        the second end of the protrusion portion attached to the outer side surface of the bending area at the second side thereof, and
        the first end of the protrusion portion located at the second side of the bending area and further from the sub area then the second end.

8. The display device according to claim 1, wherein
    the bending area includes a first side closest to a boundary between the main area and the bending area, and a second side which is opposite to the first side and closest to a boundary between the sub area and the bending area,
    the protrusion portion includes a first end and a second end opposing each other,
    the display panel which is unbent provides the first end and the second end of the protrusion portion attached to the outer side surface of the bending area at the first side and the second side thereof, respectively, and
    the display panel which is bent provides:
        the first end of the protrusion portion attached to the outer side surface of the bending area at the boundary between the main area and the bending area, and
        the second end of the protrusion portion attached to the outer side surface of the bending area at the boundary between the sub area and the bending area.

9. The display device according to claim 1, wherein the coating layer directly covers the protrusion portion.

10. The display device according to claim 1, wherein the coating layer includes a photopolymer resin.

11. The display device according to claim 1, wherein 5 protrusion portion is removably attachable to the outer side surface of the display panel by the coating layer.

* * * * *